United States Patent
Waldfried et al.

(10) Patent No.: US 7,078,161 B2
(45) Date of Patent: Jul. 18, 2006

(54) PLASMA ASHING PROCESS FOR REMOVING PHOTORESIST AND RESIDUES DURING FERROELECTRIC DEVICE FABRICATION

(75) Inventors: Carlo Waldfried, Falls Church, VA (US); Qingyuan Han, Columbia, MD (US); Orlando Escorcia, Falls Church, VA (US); Ebrahim Andideh, Portland, OR (US)

(73) Assignees: Axcelis Technologies, Inc., Beverly, MA (US); Intel Corporation, Santa Clara, CA (US)

( * ) Notice: Subject to any disclaimer, the term of this patent is extended or adjusted under 35 U.S.C. 154(b) by 211 days.

(21) Appl. No.: 10/248,707

(22) Filed: Feb. 11, 2003

(65) Prior Publication Data
US 2004/0157170 A1    Aug. 12, 2004

(51) Int. Cl.
*G03F 7/42* (2006.01)

(52) U.S. Cl. .......... 430/329; 430/320; 134/1.1
(58) Field of Classification Search .......... 430/311, 430/320, 329; 134/1, 1.1, 1.2
See application file for complete search history.

(56) References Cited

U.S. PATENT DOCUMENTS

| 6,320,213 B1 | 11/2001 | Kirlin et al. | 257/295 |
| 6,485,988 B1 | 11/2002 | Ma et al. | 438/3 |
| 2001/0048622 A1 | 12/2001 | Kwon et al. | 365/200 |
| 2003/0032300 A1* | 2/2003 | Waldfried et al. | 438/725 |

* cited by examiner

*Primary Examiner*—Kathleen Duda
(74) *Attorney, Agent, or Firm*—Cantor Colburn LLP

(57) ABSTRACT

A low temperature plasma ashing process for use with substrates comprising a ferroelectric material. The process generally includes plasma ashing the photoresist and residues at a temperature of about room temperature to about 140° C., wherein the plasma is generated from a gas mixture consisting essentially of hydrogen and an inert gas, and wherein the ferroelectric material is exposed to the plasma.

22 Claims, 3 Drawing Sheets

PLASMA ASHING PROCESS FOR REMOVING PHOTORESIST AND RESIDUES DURING FERROELECTRIC DEVICE FABRICATION

BACKGROUND

This disclosure relates to polymer ferroelectric materials, and more particularly, to processes for removing photoresist and residues during the fabrication of integrated circuits employing ferroelectric materials.

FeRAM devices are a non-volatile form of memory that utilizes a thin film of a ferroelectric material as a capacitor dielectric. The ferroelectric materials generally have a dielectric constant in the hundreds or thousands at room temperature and two stable remanent polarization states. Ferroelectric materials include ceramics, polymers, and some minerals, wherein each type of material has a crystal structure that can be electrically polarized and that polarization can be reversed when the proper electrical field is applied. Once a ferroelectric material is polarized, all the molecules are aligned so that one side of the crystal is positively charged and the other side is negatively charged. Reversing the polarization can occur by connecting the ferroelectric material to a battery or other power supply.

It is known that ferroelectric materials are generally sensitive to elevated temperature exposure as well as to chemical attack, which ferroelectric materials are frequently exposed to during fabrication of FeRAM devices, e.g., during etching, annealing, cleaning, or the like. For example, above a certain temperature, called the Curie temperature, the heat breaks forces aligning the atoms, which causes the crystal structure to become more symmetric resulting in a loss of the ferroelectric polarizability. The Curie temperature for each ferroelectric material is different and can even be lower than room temperature. In this last case, the crystals would be symmetrical at room temperature, but cooling them below their Curie temperature would change them to the ferroelectric state.

The nonvolatile memory device with the ferroelectric thin film uses the principle that if an electric field is applied to the device to adjust the orientation of polarization and to input a signal, then the orientation of remanent polarization remained when the electric field is removed makes the digital signal 1 or 0 be stored in the device. As such, the FeRAM devices can be used to store information at power off conditions and is comparable in operating speed to the conventional DRAM.

Ferroelectric random access memories that incorporate capacitor thin films having ferroelectric properties are becoming more common. The use of a ferroelectric material as the capacitor thin film in place of a conventional silicon oxide film or a silicon nitride film provides improved low-voltage and high-speed performance. Further, the residual polarization of the ferroelectric materials means that FeRAMs do not require a periodic refresh to prevent loss of information during standby intervals like conventional dynamic random access memory (DRAM). FeRAMs also provide this non-volatile performance without requiring the more complex structure of a conventional SRAM, thereby allowing increased densities.

In a conventional fabrication method of a FeRAM device, a bottom electrode, a ferroelectric thin film, and a top electrode are formed on the semiconductor substrate. Each electrode is lithographically patterned using a photoresist masking layer and a dry etching process to form individual memory pixels. The dry etching process is typically performed by a plasma mediated process such as by RF (radio frequency) or by microwave power of hundreds kHz (kilohertz) or several GHz (gigahertz). After etching, the remaining photoresist as well as residues formed during etch are removed, while desirably preserving the physical, chemical, and electrical properties of the ferroelectric material. Traditionally, post etch photoresist and residues are removed with relatively high temperature plasma ashing processes using fluorine or chlorine gas mixtures, wet chemical stripping processes, or a combination thereof. However, the ferroelectric characteristics are easily deteriorated with current high temperature plasma ashing processes as well as during prolonged contact with the wet stripping process chemicals. This deterioration results in decreasing the reading and writing performances of FeRAM devices and reducing the lifetime of the device.

It is important to note that plasma ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The etching plasma generally includes high energy ion bombardment at low temperatures to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and generally is chosen to remove the photoresist mask layer at a rate much greater than the removal rate of the underlying substrate. Moreover, most ashing processes heat the substrate to temperatures greater than 200° C. to increase the plasma reactivity. Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing layers comprising the underlying substrate.

Current plasma ashing processes are especially unacceptable for use during fabrication of polymer FeRAM devices due primarily to the use of high temperatures (greater than about 200° C., as noted above), which deleteriously affect the electrical and chemical properties of the polymer ferroelectric material. Most prior art phototresist removal processes for ferroelectric device fabrication, if not all, describe a wet chemistry process (with no plasma ashing) to provide complete removal of the photoresist and residues. However, throughputs using wet chemistry alone are generally slow and inefficient resulting in prolonged contact times between the liquid chemicals employed in the wet chemistry processing and the substrate. As a result, chemical attack of the ferroelectric material can occur as well as the introduction of defects due to direct contact of the wet chemicals with the substrate.

Accordingly, it is desirable to have a photoresist and residue removal process for use with substrates comprising ferroelectric materials that do not deleteriously affect the properties of the ferroelectric material. The removal process should be non-oxidizing and non-damaging to the polymer ferroelectric materials, employ temperatures that do not affect the properties of the polymer ferroelectric material, and be amenable to high throughput processing as is highly desired for semiconductor manufacturing processes. Moreover, the removal process should minimize or eliminate any wet chemical processing since wet chemical processing has a propensity of introducing defects as a result of the direct contact of the chemicals with the substrate.

BRIEF SUMMARY

Disclosed herein is a method for removing photoresist and residues from a substrate comprising a ferroelectric material, which comprises plasma ashing the photoresist and residues at a temperature of about room temperature to about 140° C., wherein the plasma is generated from a gas mixture consisting essentially of hydrogen and an inert gas, and wherein the polymer ferroelectric material is exposed to the plasma.

In another embodiment, a method for removing photoresist and residues from a substrate comprising a polymer ferroelectric material comprises plasma ashing a crust portion of a photoresist layer at a temperature of about room temperature to less than about 140° C., wherein the plasma is generated from a gas mixture consisting essentially of hydrogen and an inert gas, and wherein the polymer ferroelectric material is exposed to the plasma; and wet cleaning to remove a remaining portion of the photoresist layer underlying the crust portion.

In another embodiment, a method for removing photoresist and residues from a substrate comprising a ferroelectric polymer comprises exposing the substrate to a plasma ashing process, wherein the plasma ashing process comprises generating a plasma from a gas mixture consisting essentially of hydrogen and an inert gas at a temperature less than about 140° C. and at a pressure of about 0.1 to about 3 Torr; and volatilizing the photoresist and residues from the substrate without damaging the ferroelectric polymer.

The above described and other features are exemplified by the following figures and detailed description.

BRIEF DESCRIPTION OF DRAWINGS

Referring now to the figures, wherein the like elements are numbered alike.

DETAILED DESCRIPTION

Figure 1:
FIG. 1 pictorially illustrates a top down scanning electron micrographs of a ferroelectric polymer structure with a photoresist layer disposed thereon.

A process for removing photoresist and residues from a substrate comprising a ferroelectric material generally comprises exposing the substrate to a low temperature plasma ashing process at temperatures less than a critical temperature of the particular ferroelectric material. A critical temperature is hereinafter defined as a combination of the Curie temperature for the particular ferroelectric material wherein polarization properties are lost, and the physical and structural temperature limitations inherent to the particular polymer ferroelectric material. For example, if a temperature greater than the Curie temperature is employed, upon cooling the polarization properties should return absent some physical or structural change to the polymer ferroelectric material. However, if the temperature is greater than the Curie temperature, and the physical and structural temperature limitations, then the ferroelectric properties are likely to be deleteriously changed or permanently lost upon cooling.

In a preferred embodiment, the ferroelectric material is a ferroelectric polymer. Suitable ferroelectric polymers include, but are not intended to be limited to, polyvinylidine flouride polymers, copolymers, and terpolymers such as, for example, polyvinylidine fluoride P(VDF), polyvinylidine fluoride-trifluoroethylene P(VDF-TrFE), polyvinylidine fluoride tetrafluoroethylene P(VDF-TFE), polyvinylidine fluoride trifluoroethylene-hexafluoropropylene P(VDF-TFE-HFE), polyvinylidine fluoride-hexafluoropropylene P(VDF-HFE), polyvinylidene fluoride-trifluorethylene-chlorofluoroethylene P(VDF-TrFE-CFE), polyvinylidene fluoride-trifluoroethylene-chlorotrifluoroethylene P(VDF-TrFE-CTFE), polyvinylidene fluoride-tetrafluoroethylene-chlorotrifluoroethylene, polyvinylidene fluoride-trifluorethylene-hexafluoroethylene, polyvinylidene fluoride-tetrafluorethylene-hexafluoroethylene, polyvinylidene fluoride-trifluorethylene-tetrafluoroethylene, polyvinylidene fluoride-tetrafluorethylene-tetrafluoroethylene, polyvinylidene fluoride-trifluorethylene-vinyl fluoride, polyvinylidene fluoride-tetrafluorethylene-vinyl fluoride, polyvinylidene fluoride-trifluorethylene-perfluoro(methyl vinyl ether), polyvinylidene fluoride-tetrafluorethylene-perfluoro (methyl vinyl ether), polyvinylidene fluoride-trifluorethylene-bromotrifluoroethylene, polyvinylidene fluoride-tetrafluorethylene-bromotrifluoroethylene, polyvinylidene fluoride-tetrafluorethylene-chlorofluoroethylene, polyvinylidene fluoride-trifluorethylene-vinylidene chloride, and polyvinylidene fluoride-tetrafluorethylene-vinylidene chloride.

In addition to the use of low temperatures, the plasma is preferably non-oxidizing and does not chemically or physically damage the ferroelectric material during exposure thereto. Preferably, the plasma is formed from a gas mixture consisting of hydrogen and an inert gas. Suitable inert gases include helium, neon, argon, krypton, xenon, and the like. In a preferred embodiment, the plasma is formed from a gas mixture consisting essentially of helium and hydrogen. Advantageously, this non-oxidizing plasma and low temperature processing removes photoresist and residues at high throughputs without chemically or physically damaging the polymer ferroelectric material. Moreover, the low temperature processing and non-oxidizing plasma is effective for removing chemically modified photoresist, also referred to by those in the art as a crust, which can occur as a result of prior processing of the substrate. For example, modification of the upper portion of the photoresist layer can occur as a result of ion bombardment during etching, hence the use of the term "crust". Modification of photoresist during etching is not very well understood and is believed to be related to reaction of the etchant ions, e.g., fluorine, chlorine, and the like, with the polymer in the photoresist. A subsequent wet stripping process or deionized aqueous rinse process may then be employed to effectively remove any remaining photoresist or residues.

The crust portion of the photoresist layer is relatively nonporous and is difficult to subsequently remove using conventional wet or dry stripping processes. For example, stripping photoresist having this crust using wet chemical strippers requires longer throughputs since the dissolution behavior of the crust portion requires longer contact time with the strippers. Moreover, the dissolution behavior of the crust portion is not very uniform resulting in non-uniform removal of the photoresist layer.

In one embodiment, the photoresist and residue removal process comprises a plasma ashing process at temperature less than about 140° C. for removing the crust portion followed by a wet stripping process to completely remove the post etch photoresist and residues. In this manner, dissolution behavior during the wet chemical processing is controlled since the crust portion is removed by plasma ashing. Advantageously, the plasma ashing process improves throughput by reducing the overall time for photoresist and residue removal, as well as minimizes the amount of contact with the wet chemicals.

In a preferred embodiment, the plasma gas mixture consists essentially of about 1 to about 20 percent by volume of hydrogen ($H_2$) gas in the inert gas, with about 1 to about 10 percent by volume more preferred, and with about 3 to about 5 even more preferred, wherein the percent by volume of hydrogen is based on the total volume of the gas mixture.

During plasma ashing, the substrates are preferably heated in the reaction chamber of the plasma asher to a temperature of about room temperature to about 140° C., with temperatures of about 50° C. to about 130° C. more preferred, and with temperature of about 50° C. to about 100° C. even more preferred. The temperatures used during processing may be constant or alternatively, ramped or stepped during processing. The pressure within the reaction chamber is preferably maintained at about 0.1 torr to about 3 torr. Total process time is preferably less than about 5 minutes.

During operation, an excitable gas mixture is fed into the plasma-generating chamber via a gas inlet. The gas mixture is exposed to an energy source within the plasma-generating chamber, e.g., microwave energy, preferably about 2,000 watts (W) and 3,800 W, to generate excited or energetic atoms from the gas mixture. The generated plasma is comprised of electrically neutral and charged particles formed from the gases used in the plasma gas mixture. The charged particles are selectively removed prior to plasma reaching the wafer. Preferably, the gas mixture for forming the plasma consists essentially of the hydrogen and inert gas mixture as previously described. The total gas flow rate is preferably from about 500 to 12,000 standard cubic centimeters per minute (sccm) for a 200 mm downstream plasma asher. The photoresist and residues are selectively removed from the wafer by reaction with the excited or energetic atoms generated by the plasma.

In one embodiment, substantially all of the photoresist and residues are removed by plasma ashing. In another embodiment, the low temperature plasma ashing process removes a portion of the photoresist layer. Preferably, the portion of the photoresist removed is the crust portion. The remaining photoresist and/or residues may be further stripped by conventional means using an appropriate wet stripper. The particular wet strippers used are well within the skill of those in the art. For example, acid strippers such as hydrofluoric acid, and basic strippers such as ammonia, are commonly employed as wet strippers and may be suitable for use in the present disclosure. In operation, the wet stripper is immersed, puddled, streamed, sprayed, or the like onto the substrate and subsequently rinsed with deionized water. Preferably, the choice of wet stripper is inert to the polymer ferroelectric material.

Optionally, a rinsing step is employed immediately after the wet or dry stripping step to remove contaminants and/or photoresist residuals. Preferably, the rinsing step employs deionized water but may also include hydrofluoric acid and the like, as is known in the art. The rinsing step, if applied, preferably comprises a spin rinse of about 5 to about 10 minutes followed by a spin drying process.

The process can be practiced in numerous types of plasma ashers and is not intended to be limited to any particular plasma asher. For example, a plasma asher employing an inductively coupled plasma reactor could be used or a downstream plasma asher could be used. Preferably, the plasma asher is a downstream plasma asher, such as for example, microwave plasma ashers commercially available under the trade name Axcelis ES3i® from the Axcelis Technologies, Inc. in Rockville, Md.

The following examples fall within the scope of, and serve to exemplify, the more generally described methods set forth above. The examples are presented for illustrative purposes only, and are not intended to limit the scope of the invention.

EXAMPLE 1

In this example, a photoresist layer was removed from a polymer FeRAM device by a plasma ashing without damaging the ferroelectric material contained therein. The FeRAM device was disposed on a semiconductor substrate and included a poly (vinylidene fluoride)/trifluoroethylene ferroelectric material at a thickness of about 100 nm sandwiched between M1 and M2 metal layers. The M1 layer consisted of a pad area from which parallel metal lines extend therefrom. The M2 layer had a similar configuration as the M1 metal layer, wherein the parallel metal lines extending from the M2 pad area are orthogonal with respect to the parallel metal lines of the M1 layer. A photoresist was coated onto the FeRAM device. The photoresist was a DUV photoresist. FIG. 1 pictorially illustrates a scanning electron micrograph of the photoresist coated M2 in aFeRAM device prior to ashing.

Figure 2:
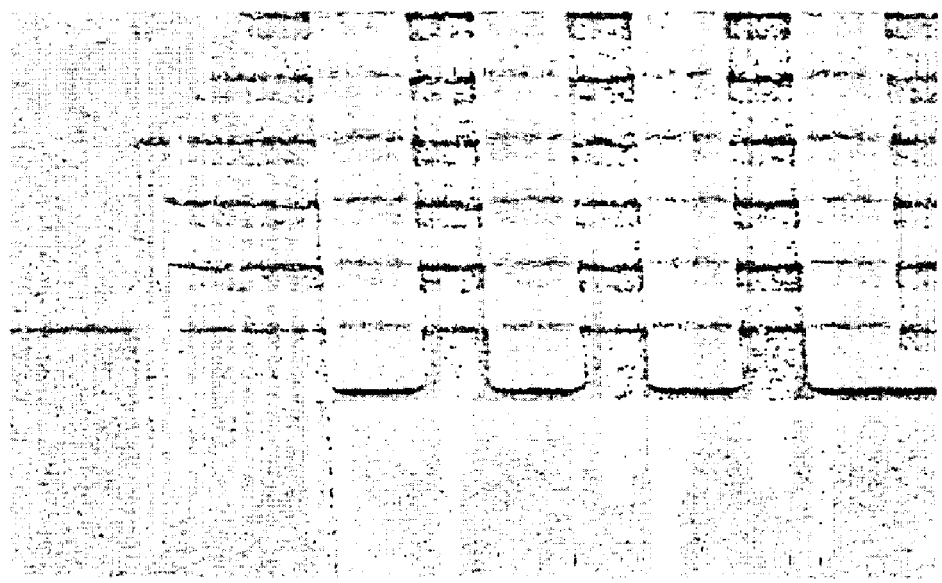
FIG. 2 pictorially illustrates a top down scanning electron micrographs of a ferroelectric structure of FIG. 1 after a photoresist removal process.

The photoresist was removed by placing the substrate into the Axcelis ES3i downstream plasma reactor. Plasma was generated from gas mixture consisting of hydrogen and helium at a microwave energy of 3,800 W and a pressure of 1 Torr. The hydrogen gas flowed at a rate of 320 sccm whereas the helium gas flowed at a rate of 7,680 sccm. The substrate was then spin rinsed with deionized water, followed by a spin dry process. FIG. 2 pictorially illustrates a scanning electron micrograph after complete removal of the photoresist layer. Advantageously, no visual damage was observed to the underlying FeRAM structure.

Figure 3:
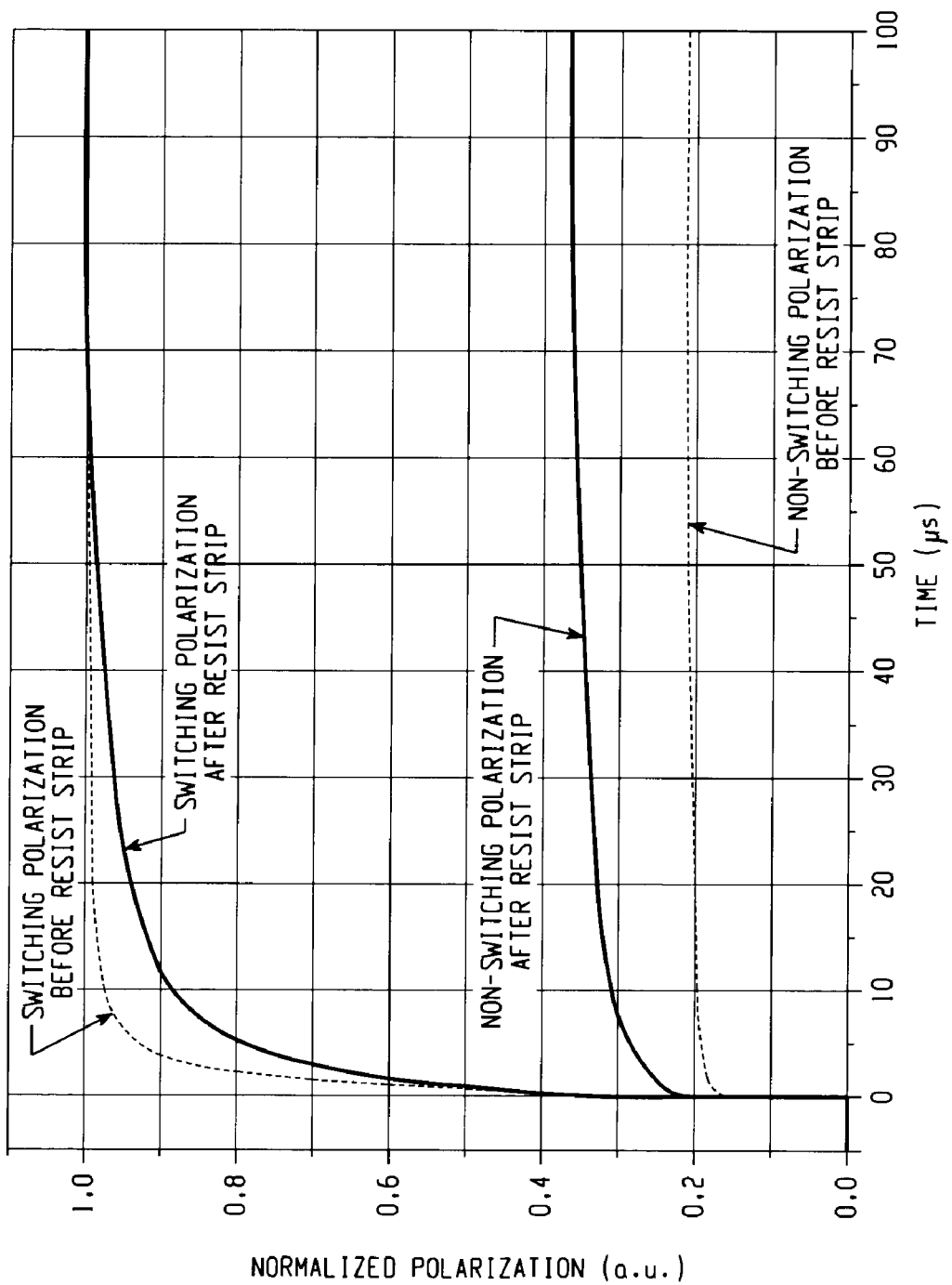
FIG. 3 graphically illustrates normalized polarization as a function of time of a ferroelectric structure before and after a photoresist removal process.

FIG. 3 graphically illustrates the polarization state as a function of time for the FeRAM device prior to and after exposure to the photoresist removal process. No significant impact to polarization charge density or switching speed is observed as a result of the ashing process.

Figure 4:
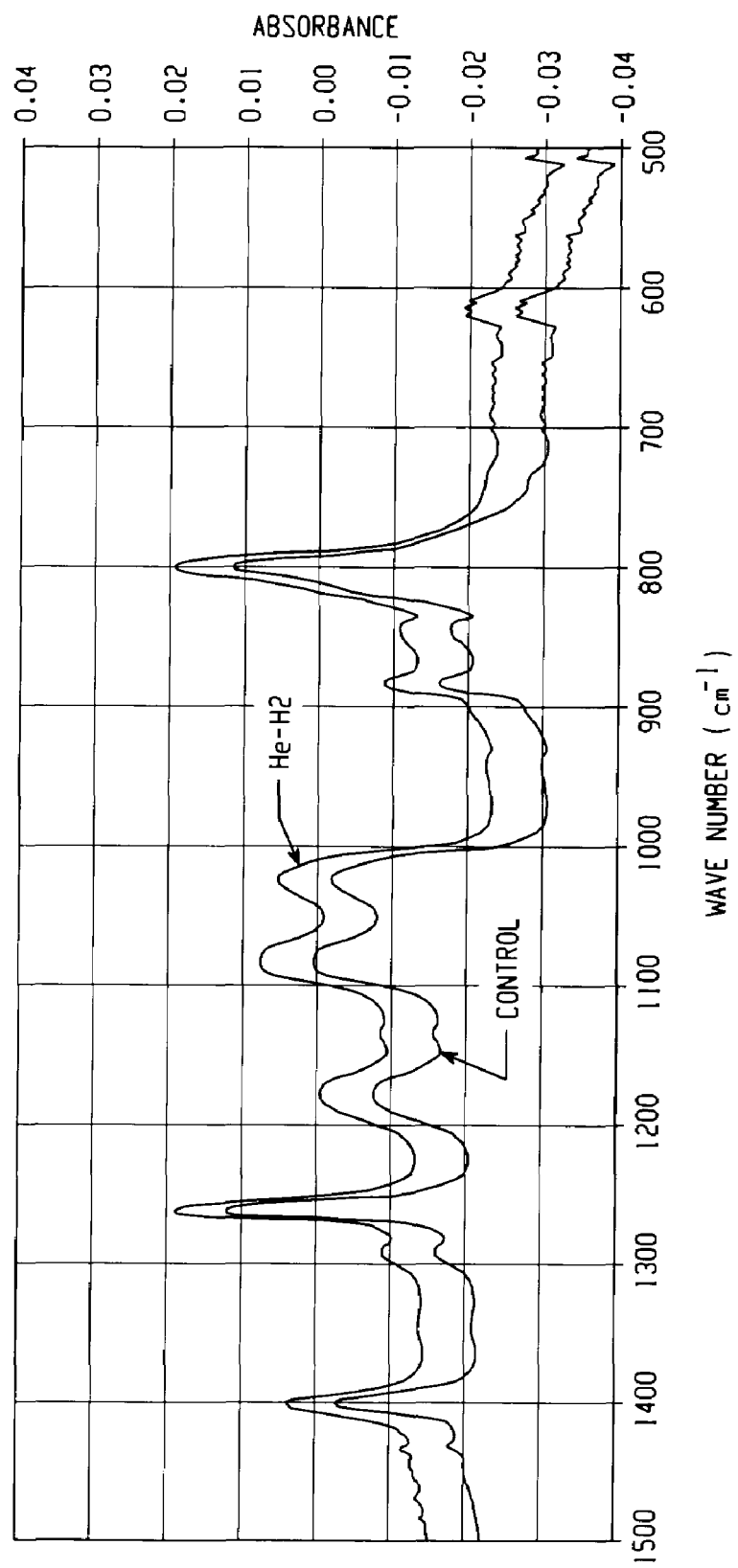
FIG. 4 graphically illustrates a Fourier Transmission Infrared (FTIR) spectrum of a ferroelectric polymer before and after exposure to a photoresist removal process.

FIG. 4 illustrates an FTIR of the ferroelectric material before and after exposure to the photoresist removal process. No change in peak shape is observed indicating that the process does not chemically change the ferroelectric material.

In summary, the low temperature plasma ashing process advantageously produced no significant change in the electrical or chemical properties that would affect operation of the FeRAM device. Moreover, high throughput can be obtained.

Advantageously, ferroelectric devices can be fabricated using the low temperature plasma ashing process without any significant changes to the electric or chemical properties of the polymer ferroelectric material. Moreover, the low temperature plasma ashing process minimizes or eliminates outgassing during plasma ashing of the photoresist and/or residues. Still further, the process effectively removes the crust portion of the photoresist and/or residues with throughputs amenable to cost effective semiconductor manufacturing. As a result, the process permits the use of wet strippers with well defined dissolution rates since the crust portion is removed and with minimal contact time.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for removing photoresist and residues from a substrate comprising a ferroelectric material, which comprises:
    plasma ashing the photoresist and residues at a temperature of about room temperature to about 140° C., wherein the plasma is generated from a gas mixture consisting essentially of hydrogen and an inert gas, and wherein the ferroelectric material is exposed to the plasma.

2. The method of claim 1, wherein the inert gas is selected from the group consisting of argon, helium, xenon, krypton, and neon.

3. The method of claim 1, wherein the gas mixture consists essentially of hydrogen and helium.

4. The method of claim 1, wherein the ferroelectric material comprises a polymer, a ceramic, or a mineral.

5. The method of claim 1, wherein the ferroelectric material comprises a polymer comprising polyvinylidine fluoride, polyvinylidine fluoride-trifluoroethylene, polyvinylidine fluoride tetrafluoroethylene, polyvinylidine fluoride trifluoroethylene-hexafluoropropylene, polyvinylidine fluoride-hexafluoropropylene, polyvinylidene fluoride-trifluorethylene-chlorofluoroethylene, polyvinylidene fluoride-trifluoroethylene-chlorotrifluoroethylene, polyvinylidene fluoride-tetrafluoroethylene-chlorotrifluoroethylene, polyvinylidene fluoride-trifluorethylene-hexafluoroethylene, polyvinylidene fluoride-tetrafluorethylene-hexafluoroethylene, polyvinylidene fluoride-trifluorethylene-tetrafluoroethylene, polyvinylidene fluoride-tetrafluorethylene-tetrafluoroethylene, polyvinylidene fluoride-trifluorethylene-vinyl fluoride, polyvinylidene fluoride-tetrafluorethylene-vinyl fluoride, polyvinylidene fluoride-trifluorethylene-perfluoro(methyl vinyl ether), polyvinylidene fluoride-tetrafluorethylene-perfluoro(methyl vinyl ether), polyvinylidene fluoride-trifluorethylene-bromotrifluoroethylene, polyvinylidene fluoride-tetrafluorethylene-bromotrifluoroethylene, polyvinylidene fluoride-tetrafluorethylene-chlorofluoroethylene, polyvinylidene fluoride-trifluorethylene-vinylidene chloride, or polyvinylidene fluoride-tetrafluorethylene-vinylidene chloride.

6. The method of claim 1, wherein the temperature is about 50° C. to about 130° C.

7. The method of claim 1, wherein the gas mixture consists essentially of hydrogen at about 1 to about 20 percent by volume and inert gas at about 80 to about 99 percent by volume based on the total volume of the gas mixture.

8. The method of claim 1, further comprising rinsing the substrate with deionized water.

9. The method of claim 1, further comprising rinsing the substrate with a wet chemical stripper.

10. The method of claim 1, wherein the temperature is about 50° C. to about 100° C.

11. A method for removing photoresist and residues from a substrate comprising a polymer ferroelectric material, which comprises:
    plasma ashing a crust portion of a photoresist layer at a temperature of about room temperature to about 140° C., wherein the plasma is generated from a gas mixture consisting essentially of hydrogen and an inert gas, and wherein the polymer ferroelectric material is exposed to the plasma; and
    wet cleaning to remove a remaining portion of the photoresist layer underlying the crust portion.

12. The method of claim 11, wherein the polymer ferroelectric material comprises polyvinylidine fluoride, polyvinylidine fluoride-trifluoroethylene, polyvinylidine fluoride tetrafluoroethylene, polyvinylidine fluoride trifluoroethylene-hexafluoropropylene, polyvinylidine fluoride-hexafluoropropylene, polyvinylidene fluoride-trifluorethylene-chlorofluoroethylene, polyvinylidene fluoride-trifluoroethylene-chlorotrifluoroethylene, polyvinylidene fluoride-tetrafluoroethylene-chlorotrifluoroethylene, polyvinylidene fluoride-trifluorethylene-hexafluoroethylene, polyvinylidene fluoride-tetrafluorethylene-hexafluoroethylene, polyvinylidene fluoride-trifluorethylene-tetrafluoroethylene, polyvinylidene fluoride-tetrafluorethylene-tetrafluoroethylene, polyvinylidene fluoride-trifluorethylene-vinyl fluoride, polyvinylidene fluoride-tetrafluorethylene-vinyl fluoride, polyvinylidene fluoride-trifluorethylene-perfluoro(methyl vinyl ether), polyvinylidene fluoride-tetrafluorethylene-perfluoro(methyl vinyl ether), polyvinylidene fluoride-trifluorethylene-bromotrifluoroethylene, polyvinylidene fluoride-tetrafluorethylene-bromotrifluoroethylene, polyvinylidene fluoride-tetrafluorethylene-chlorofluoroethylene, polyvinylidene fluoride-trifluorethylene-vinylidene chloride, or polyvinylidene fluoride-tetrafluorethylene-vinylidene chloride.

13. The method of claim 11, wherein the temperature is about 50° C. to about 130° C.

14. The method of claim 11, wherein the gas mixture consists essentially of hydrogen at about 1 to about 20 percent by volume and the inert gas at about 80 to about 99 percent by volume based on the total volume of the gas mixture.

15. The method of claim 11, further comprising rinsing the substrate with deionized water.

16. The method of claim 11, wherein the temperature is about 50° C. to about 100° C.

17. The method of claim 11, wherein the inert gas is selected from the group consisting of argon, helium, xenon, krypton, and neon.

18. The method of claim 11, wherein the gas mixture consists essentially of hydrogen and helium.

19. A method for removing photoresist and residues from a substrate comprising a ferroelectric polymer, the method comprising:
    exposing the substrate to a plasma ashing process, wherein the plasma ashing process comprises generating a plasma from a gas mixture consisting essentially of hydrogen and an inert gas at a temperature less than about 140° C. and at a pressure of about 0.1 to about 3 Torr; and volatilizing the photoresist and residues from the substrate without damaging the ferroelectric polymer.

20. The method of claim 19, wherein the gas mixture consists essentially of hydrogen at about 1 to about 20 percent by volume and helium at about 80 to about 99 percent by volume based on the total volume of the gas mixture.

21. The method of claim 19, wherein the inert gas is selected from the group consisting of argon, helium, xenon, krypton, and neon.

22. The method of claim 19, wherein the gas mixture consists essentially of hydrogen and helium.

* * * * *